(12) United States Patent
Henderson

(10) Patent No.: US 7,857,668 B2
(45) Date of Patent: Dec. 28, 2010

(54) CONNECTOR MODULE FOR RUGGEDIZED APPLICATIONS

(75) Inventor: Randall Chad Henderson, Myrtle Beach, SC (US)

(73) Assignee: AVX Corporation, Myrtle Beach, SC (US)

( * ) Notice: Subject to any disclaimer, the term of this patent is extended or adjusted under 35 U.S.C. 154(b) by 330 days.

(21) Appl. No.: 12/101,388

(22) Filed: Apr. 11, 2008

(65) Prior Publication Data

US 2009/0257199 A1 Oct. 15, 2009

(51) Int. Cl.
*H01R 33/00* (2006.01)
(52) U.S. Cl. .......................... 439/698; 439/500
(58) Field of Classification Search ................ 439/500, 439/698, 890
See application file for complete search history.

(56) References Cited

U.S. PATENT DOCUMENTS

| | | | | |
|---|---|---|---|---|
| 5,211,579 | A * | 5/1993 | Seong et al. | 439/500 |
| 5,395,263 | A * | 3/1995 | Sandell | 439/500 |
| 5,613,877 | A * | 3/1997 | Patel et al. | 439/567 |
| 5,749,737 | A * | 5/1998 | Zuin | 439/500 |
| 6,459,042 | B1 | 10/2002 | Stilianos et al. | |
| 6,530,804 | B1 * | 3/2003 | Wu | 439/500 |
| 6,579,119 | B1 * | 6/2003 | Wu | 439/500 |
| 6,623,293 | B1 * | 9/2003 | Wu | 439/500 |
| 7,500,872 | B2 * | 3/2009 | Takahashi et al. | 439/567 |

FOREIGN PATENT DOCUMENTS

| | | |
|---|---|---|
| DE | 100 62 962 A1 | 7/2002 |
| JP | 2008124244 | 5/2008 |
| WO | WO 2009/042142 | 4/2009 |

OTHER PUBLICATIONS

GB Search Report, Jul. 13, 2009.

* cited by examiner

*Primary Examiner*—Tho D Ta
(74) *Attorney, Agent, or Firm*—Dority & Manning, P.A.

(57) ABSTRACT

A connector module can be configured to provide a connection between a component such as an electrolytic capacitor and a circuit board while supporting the component in a spaced apart manner from the board Due to the connector module, secondary soldering operations can be avoided. For example, the module may comprise a body with fingers and support members that engage and support the capacitor. The body may feature a plurality of legs, each leg including spaced-apart members which fit into respective holes in the board. Each leg can include a retention and clip feature which cooperate to hold the module securely to the board. The body can include pins that engage electrodes of the capacitor and provide a connection to the board. In some embodiments, a locking cover can include a ring that engages the capacitor body while also ensuring a secure connection between the electrodes of the capacitor and pins of the module.

20 Claims, 9 Drawing Sheets

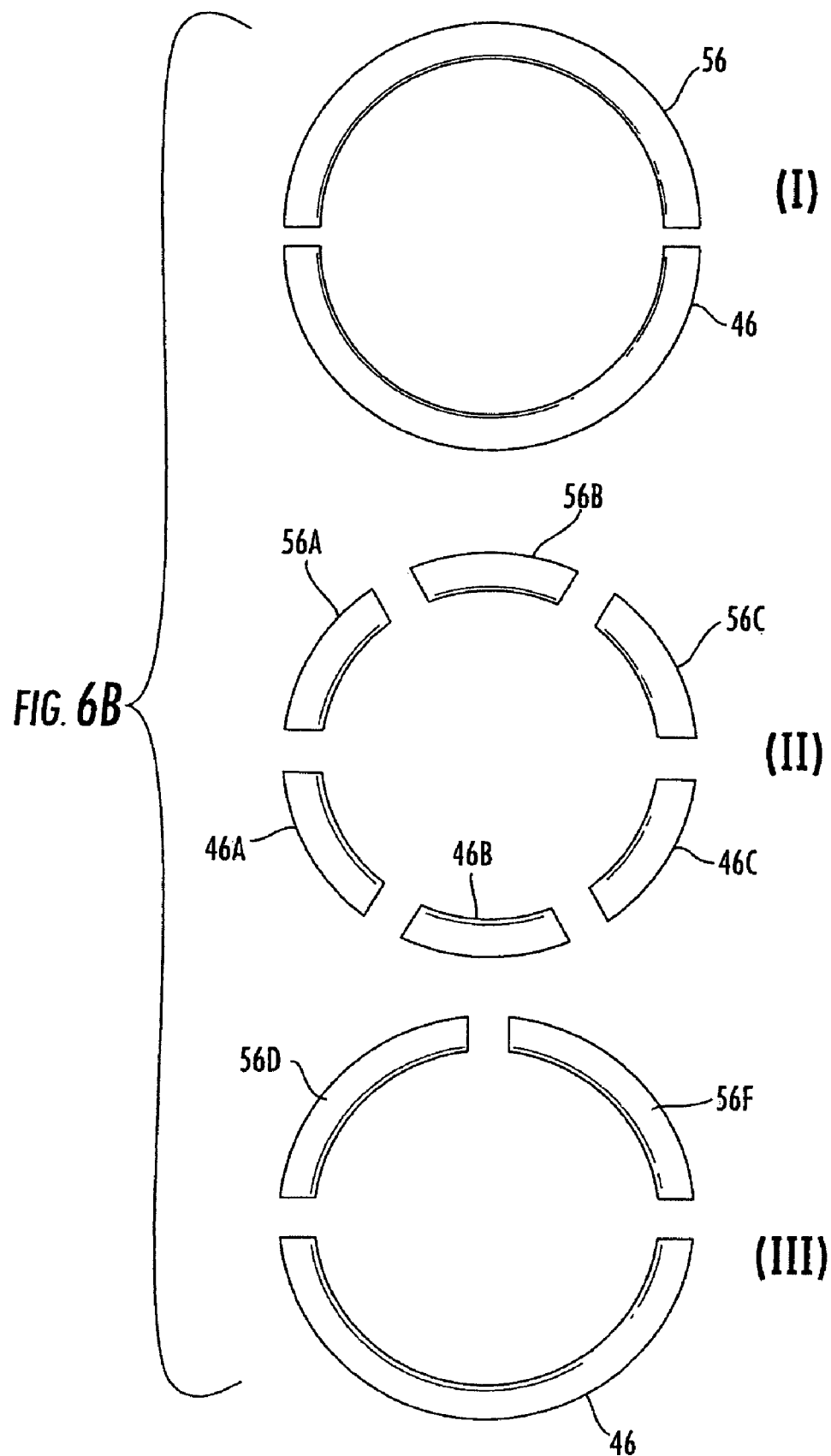

CONNECTOR MODULE FOR RUGGEDIZED APPLICATIONS

BACKGROUND

Electronic and other circuit designs often depend upon factors beyond the characteristics of the components comprising the circuit. As an example, a circuit in an automobile, such as a circuit used to control deployment of an airbag, may be contained in a housing used to protect the circuit board and its components. In an automotive or other application, it may be advantageous to minimize the overall space occupied by the circuit (or circuits).

Some components, such as capacitors, may require a significant amount of real estate on a circuit board relative to the other components. For example, an electrolytic capacitor may require a significantly larger area than resistors, inductors, transistors, and/or other components in a circuit.

Automated manufacture of electronic circuits can involve a number of steps, including soldering circuit components to printed circuit boards and the like. Automated soldering often involves high temperatures which cannot always be tolerated by all types of components. Electrolytic capacitors, for example, are often characterized by temperature constraints that preclude automated soldering due to the temperatures involved.

SUMMARY

Objects and advantages of the invention will be set forth in part in the following description, or may be obvious from the description, or may be learned through practice of the invention.

In accordance with one or more aspects of the presently disclosed subject matter, a connector module can be configured to provide a connection between a component (such as a capacitor) and a circuit board. The module can also support the component in a spaced apart manner from the circuit board to thereby reduce the amount of area occupied on the circuit board.

The connector module can, in some embodiments, be used to support and connect a capacitor, such as an electrolytic capacitor. However, the discussion herein of examples of connector modules used with capacitors is not meant to be limiting.

However, in the case of a capacitor, connector modules constructed in accordance with one or more aspects of the present subject matter can allow for the use of automated assembly techniques with electrolytic capacitors. Due to the connector module, often-tedious secondary soldering operations can be avoided. Instead, the connector module provides the connection between the printed circuit board and the capacitor (or other component) without the need for exposing the capacitor to the stresses of high-temperature soldering.

An exemplary connector module can support and provide connections for a wide variety of capacitors. For example, in some embodiments, a connector module can support capacitors having a diameter from about 18 to about 18.5 mm, and a length between about 20 mm and 40 mm.

In certain embodiments, the connector module may include a plurality of flexible support fingers connected to or formed as pat of a ruggedized module housing. The module can comprise a plurality of legs which, in some embodiments, allow for press-in locking of the module to a printed circuit board (PCB). Of course, in other embodiments, the module could be locked to a PCB in other ways, such as via attachment mechanisms joining the connector module to the board.

In some embodiments, the connector module can further comprise a locking ring comprising one or more protrusions which are configured to grip the component supported by the connector module. For example, the locking ring of the connector module may interface with a corresponding ring depression on a capacitor or other component supported by the module. One or more locking rings may be provided, and the components may have one or more respective depressions.

The locking ring may be split between the module housing and a separate cover which can be selectively attached to the module housing. For example, the cover may comprise a plurality of tabs which lockingly engage corresponding portions of the module body to securely hold the cover to the body.

One cover may be used in some embodiments, while in other embodiments, multiple cover pieces shield the capacitor or other components.

The connector module can comprise a plurality of pins extending downward from the module body. For instance, in some embodiments, the pins are located near one end of the connector module. The pins can be configured to pass through the body so as to engage one or more electrodes of the supported capacitor (or other component). In some embodiments, a pair of pins are provided to interface with each component electrode.

Conceivably, some or all of the pins need not pass through the body. For instance, one or more passages for leads could be provided, or leads could be positioned along and around the body to reach termination points. However, the use of in-body pins may allow for a more reliable and less complex connection.

When a cover is used, the cover can include a plurality of slots, teeth, or other suitable components which fit over and engage upper ends of the pairs of pins when the cover is positioned on the module body. Accordingly, the slots, teeth, or other components can apply pressure between the pairs of pins and their respective electrodes to ensure a good connection.

The module body can include a structure to guide the electrodes between pairs of pins. For example, a portion of the module body may extend upward from the desired point of contact, with a notch or notches which can aid in aligning the electrodes. Additionally, the portion of the body that extends upward can prevent accidental contact between the pins and the component body.

In some embodiments, the pins are all arranged at the same end of the module body and a single cover is used. For example, the pins may be arranged in a row at one end of the module, with the module configured to support a capacitor or other component whose electrodes emerge from a single end. In some embodiments, the component is engaged by a locking ring near the end from which the electrodes emerge.

BRIEF DESCRIPTION OF THE DRAWINGS

A full and enabling disclosure, including the best mode of practicing the appended claims, directed to one of ordinary skill in the art, is set forth more particularly in the remainder of the specification, which makes reference to the appended figures, in which:

FIG. 6B provides three examples of locking ring portion arrangements for connector modules;

DETAILED DESCRIPTION

Reference will now be made in detail to various and alternative exemplary embodiments and to the accompanying drawings, with like numerals representing substantially identical structural elements. Each example is provided by way of explanation, and not as a limitation. In fact, it will be apparent to those skilled in the art that modifications and variations can be made without departing from the scope or spirit of the disclosure and claims. For instance, features illustrated or described as part of one embodiment may be used on another embodiment to yield a still further embodiment. Thus, it is intended that the instant disclosure includes modifications and variations as come within the scope of the appended claims and their equivalents.

Figure 1:
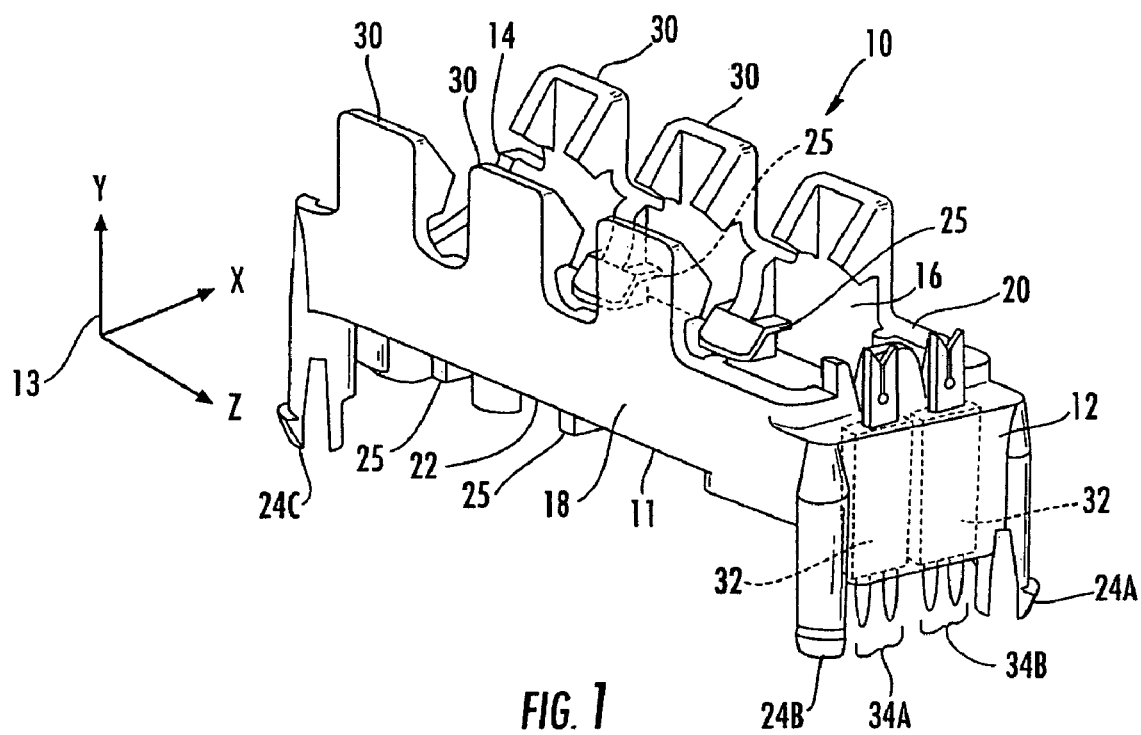
FIG. 1 is a front perspective view of an exemplary connector module.

FIG. 1 is a front perspective view of an exemplary connector module 10. In this example, the connector assembly comprises a module body 11 defining a first end 12, and a second end 14, with sides 16 and 18 extending between the ends. The module body further defines a top 20 and bottom 22.

Extending downward from bottom 22 of module body 11 are a plurality of legs 24. In this example, there are four legs 24A, 24B, 24C, and 24D (which is not visible in FIG. 1). However, in other embodiments, more or fewer legs could be used.

For purposes of convention, an axis diagram 13 is provided with certain of the figures illustrating an X, Y, and Z component axis. In the discussion below, measurements along the Z axis correspond to lengths, measurements along the X axis corresponds to widths, and measurements along the Y axis correspond to heights. The (+) Y direction generally corresponds to "upward" or "up," while the (−) Y direction corresponds to "downward" or "down." The (+) Z direction points toward first end 12 of the module. Axis 13 is provided in the perspective views of FIGS. 1, 2, 4A, 5, 8, and 9 for purposes of orientation.

Figure 1A:
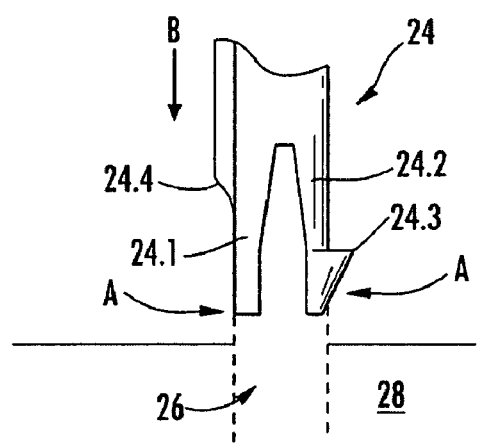
FIG. 1A is a close-up view of one exemplary leg arrangement for connector modules.

As shown in FIG. 1A, each leg 24 in this example comprises two spaced-apart members 24.1 and 24.2. Member 24.2 further includes a protrusion 24.3 (referred to as a "clip protrusion" below), while member 24.1 includes a protrusion 24.4 (referred to below as "retention feature 24.4"). Members 24.1 and 24.2 can be used to lockingly engage the connector assembly to another structure, such as a printed circuit board (PCB) 28. In practice, leg 24 can be placed above a corresponding opening 26 in PCB 28.

As indicated by the dotted lines, members 24.1 and 24.2 are sized and spaced apart so that leg 24 fits through opening 26. For instance, if leg 24 is generally cylindrical in shape and opening 26 is circular, the radius of a cross-section of leg 24 will be approximately the same as, or only slightly larger than, the radius of opening 26, if neither clip protrusion 24.3 nor retention feature 24.4 is included in the cross-section. Due to the spaced-apart configuration of members 24.1 and 24.2, force can be applied in direction B, which results in members 24.1 and 24.2 being forced toward one another in direction A when leg 24 is placed at opening 26. Clip protrusion 24.3 may be shaped to assist in achieving sufficient force to move members 24.1 and 24.2 toward one another.

Once leg 24 is pressed into opening 26, clip protrusion 24.3 and retention member 24.4 cooperate to hold the leg (and thus the connector module) tightly to PCB 28. See, for example, FIG. 7B, which shows end 14 of a connector module as seated on PCB 28. Retention feature 24.4 and clip protrusion 24.3 allow the leg to absorb board tolerances while maintaining a tight connection. In some embodiments, a retention feature 24.4 can be formed on each leg, while in other embodiments, the retention feature 24.4 is found on only some of the legs.

In one embodiment, retention feature 24.4 comprises a tapered protrusion along the length of leg 24.1 or an angled pair of faces. In any event, the protrusion or faces can form a tip. The tip can be positioned to lie opposite the midpoint of the outer surface of clip protrusion 24.3. For instance, if leg 24 is cylindrical, when viewed from the end, the tip of retention feature 24.4 and the midpoint of clip protrusion 24.3 are 180 degrees apart in one embodiment.

Figure 7A:
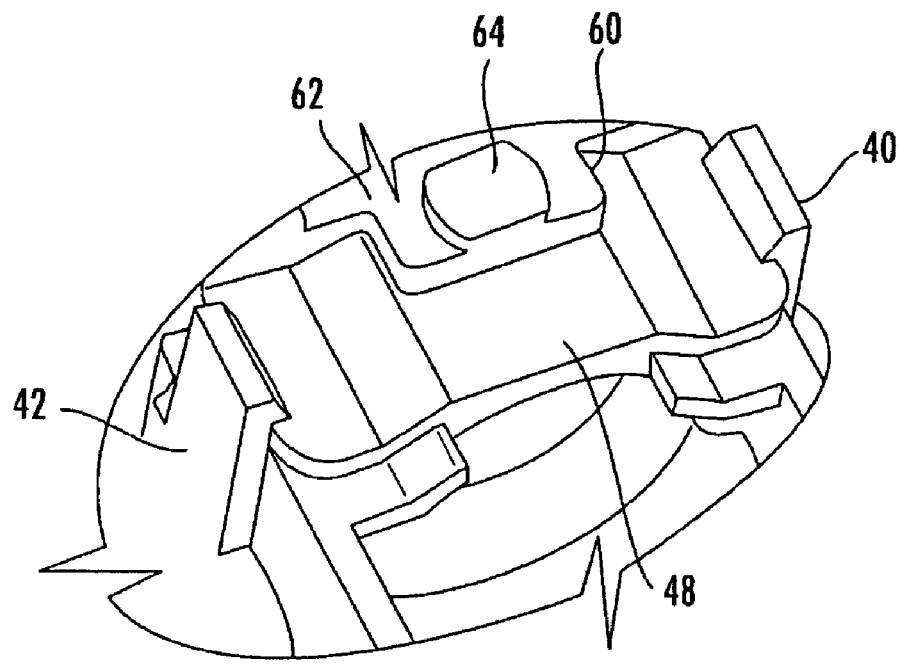
FIG. 7A is a view of the bottom side of the first end of an exemplary connector module.
Figure 7B:
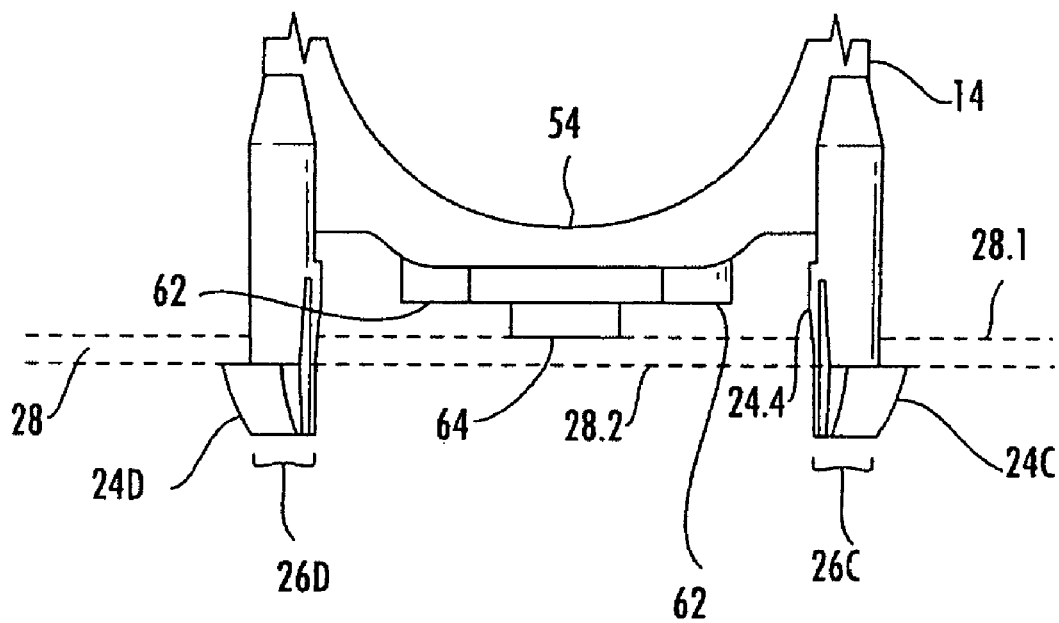
FIG. 7B is a view of the back end of an exemplary connector module showing members that support the connector module in closer detail

As can be seen in FIG. 7B, retention feature 24.4 is spaced apart from clip protrusion 24.3 along the length of leg 24 (i.e. in the y-direction) so that retention feature 24.4 contacts the top surface 28.1 of PCB 28, while the upper surface of clip protrusion 24.3 contacts the bottom surface 28.2 of PCB 28. It should be noted that, in practice, retention feature 24.4 may contact the edge of an opening in PCB 28 or even portions of the sides inside such an opening.

In any event, the angle of retention feature 24.4 causes member 24.1 to act like a spring and urge PCB 28 against clip protrusion 24.3. The tapered member and/or angled faces forming retention feature 24.4 allow for a degree of tolerance in board thickness and/or the size of opening 26.

Returning to connector module 10 and FIG. 1, module body 11 further includes a plurality of fingers 30 extending upward from sides 16 and 18, and a plurality of lower support members 25 extending inward from sides 16 and 18. Fingers 30 and lower support members 25 are configured to accommodate one or more suitable types of components, such as capacitors of various sizes.

In some embodiments, such as the examples illustrated herein, partial lower support members 27 are also included near one or both ends 12 or 14. As will be apparent from the examples below, each end 12 and 14 includes some areas or other structure(s) to support components at the end. For example, end 12 includes a component support area 48 extending between the sides at the bottom of body 11. However, partial support members 27 may be used to provide additional support in areas between lower support members 25 and other support structures at either or both ends 12 and 14.

Connector module 10 further comprises a plurality of pins 32 which extend downward from the bottom side of module body 11 at first end 12. Pins 32 extend upward through module body 11 and emerge at top 20. In this example, at top 20 and bottom 22 of the module, there are a total of four pins, which are grouped in pairs 34A and 34B for purposes of further discussion. Inside body 11, the respective pins of each pair 34A and 34B comprise a single unit (indicated by the dashed lines) that passes through the body. However, in other embodiments, each pin of pairs 34A and 34B passes through body 11 as a discrete member.

Figure 2:
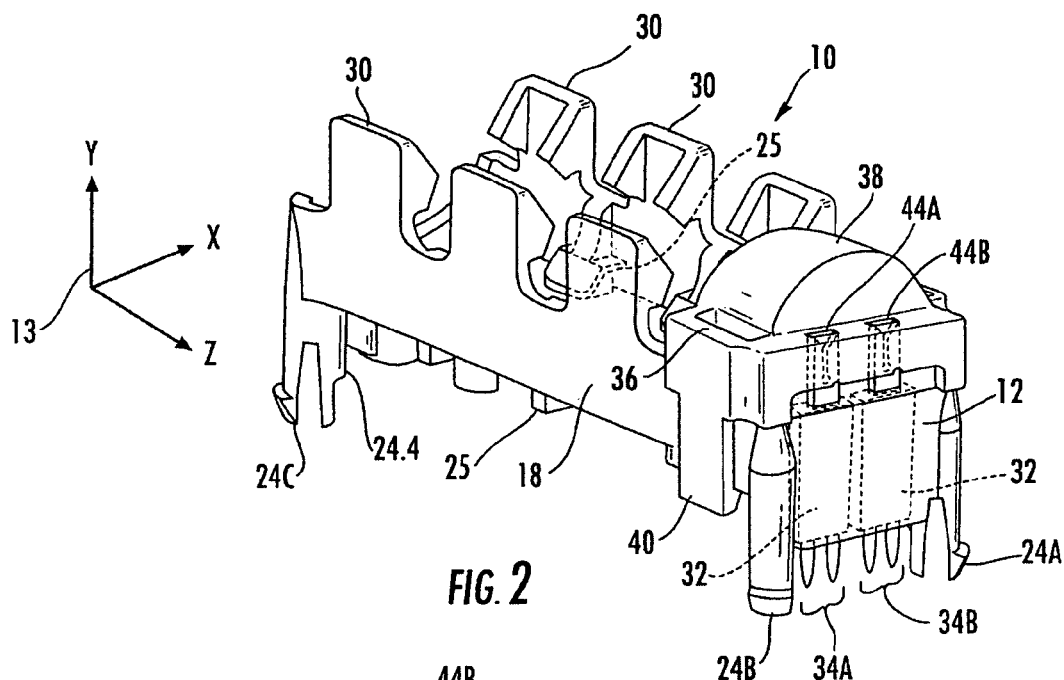
FIG. 2, shows a connector module with a locking cover positioned thereon at a first end.

Turning to FIG. 2, a connector module 10 is shown with a locking cover 36 positioned thereon at first end 12. In this example, locking cover 36 comprises a cover body 38 that extends to cover module body 11 at first end 12. Locking cover 36 further includes a plurality of tabs 40 and 42 (42 is not visible in FIG. 2) which extend downward from cover body 38 to engage sides 16 and 18 of module body 11 so as to removably secure cover 36 to module body 11.

Figure 2A:
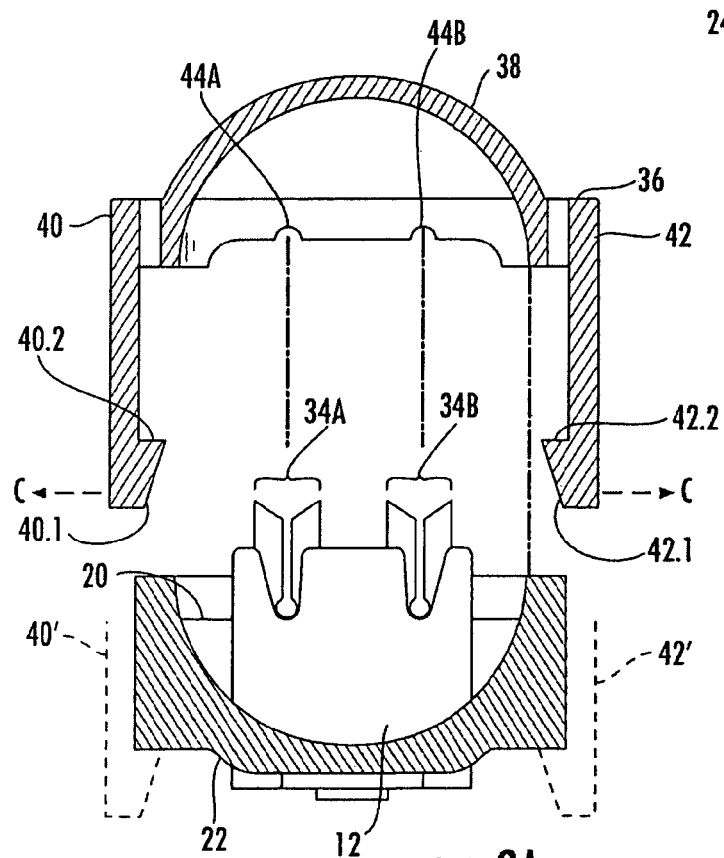
FIG. 2A is a partial view of the first end of the connector module shown in FIG. 2 to illustrate an example of how the cover locks to the module body in some embodiments.

FIG. 2A is a partial view of end 12 of module body 11 showing pin pairs 34A and 34B extending upward from top 20. Legs 24A and 24B, and the portions of pairs 34 that extend downward from bottom 22 are not shown in this view. This view further illustrates cover 36 positioned above, but not on, first end 12, in order to show how the cover can be removably secured to module body 11 in some embodiments. Namely, tabs 40 and 42 can be moved apart as shown by arrows C. For instance, tabs 40 and 42 may be moved apart when surfaces 40.1 and 42.1 are brought into contact with top 20 and downward pressure is applied to cover 36. Openings 44A and 44B in cover 36 are positioned to receive and engage respective pin pairs 34A and 34B.

As cover 36 is moved downward, tabs 40 and 42 move down sides 16 and 18 and then lockingly engage module body 11. The final position of tabs 40 and 42 is shown by the dotted lines 40' and 42', respectively. When in the final position, surfaces 40.2 and 42.2 are in contact with bottom 22 of module body 11.

Figure 3:
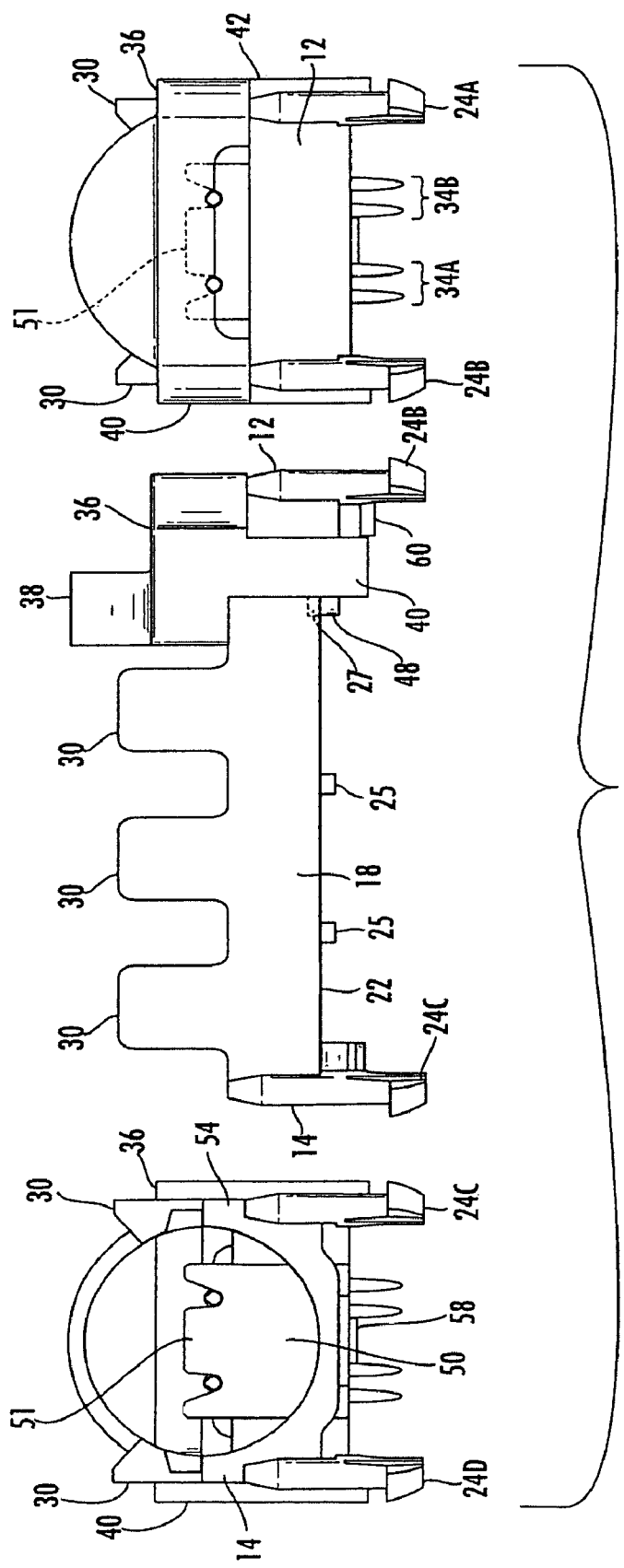
FIG. 3 provides side and end views of an exemplary connector module.

FIG. 3 includes a side view showing connector module 10 as viewed from side 18 and a view from each end 12 and 14. In this embodiment, it can be seen that there are three fingers 30 on each side, with a lower support member 25 positioned at bottom 22 intermediate each pair of fingers 30. In this view, another portion of module body 11 can be seen, namely first end support area 48. Adjacent to support area 48 is a partial lower support member 27.

In the view from end 14, rear wall 54 and body standoff 58 can be seen. Additionally, the back side of front wall 50 at end 12 can be seen from end 14 (as well as from end 12). In this view, it can be seen that front wall 50 includes a portion extending upward to define a "W" formation 51. "W" formation 51 is shown slightly exaggerated in this view since it is obscured in several other views. More specifically, front wall 50 includes two portions; the portion of wall 50 that faces end 12 extends to a first height, while the portion of wall 50 that faces end 14 (and defines "W" formation 51) extends higher. "W" formation 51 essentially comprises two notches in the higher part of wall 50. This may help guide electrodes of a supported component into alignment with pins 32 (not visible) extending through front wall 50. It will be understood that other embodiments may not utilize a "W" formation inasmuch as such embodiments provide for fewer or more electrodes. Thus, front wall 50 may feature more or fewer than the two notches in this example.

The portion of front wall 50 that faces end 14 can additionally help to avoid accidental contact between the end of a component supported on module body 11 and the ends of pins 32 that extend upward from front wall 50.

FIG. 3 also includes a view from end 12 showing cover 36, tabs 40 and 42, legs 24A and 24B, pin pairs 34A, 34B, and "W" formation 51 (in phantom). Taking the three views of FIG. 3 together, it will also be appreciated that the spaced-apart members of each leg are arranged in this embodiment so that the midpoint of each respective clip portion of each leg faces diagonally outward. Retention members 24.4 are barely visible in FIG. 3, since their respective tips face diagonally inward.

Figure 4A:
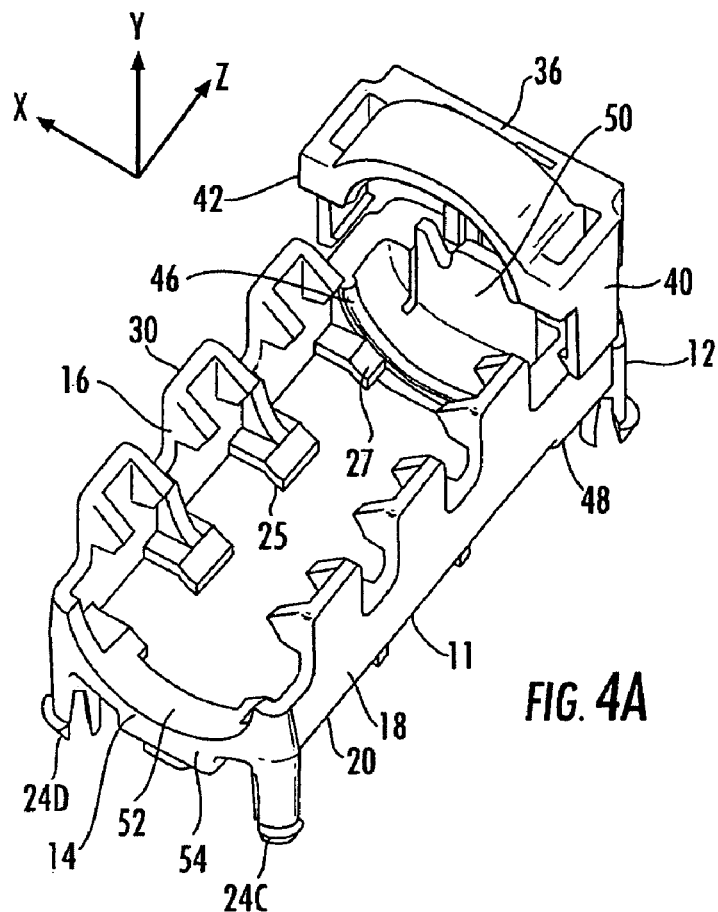
FIG. 4A is a perspective view of an exemplary connector module as viewed from the top and second end.
Figure 4B:
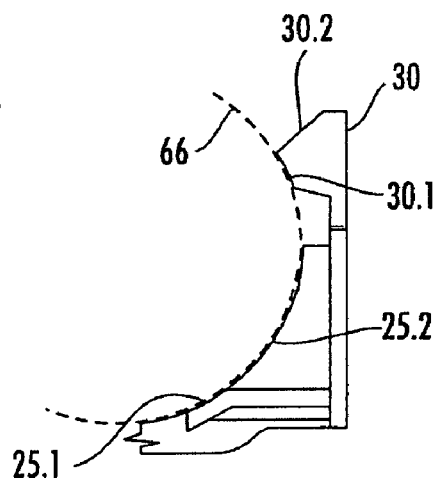
FIGS. 4B-4G show aspects of support members and fingers in the exemplary connector module of FIGS. 1-4 in closer detail.

FIG. 4A provides a better view of first end support portion 48 discussed above, along with additional exemplary features. FIG. 4A is a perspective view of module 10 as viewed from top 20 and end 14. In this view, cover 36 is partially positioned over module body 11. At first end 12, the module body 11 comprises a locking ring portion 46 and first end support portion 48. In this example, both locking ring portion 46 and the upper surface of first end support portion 48 are generally cylindrical in shape so as to accommodate and support a cylindrical component, such as a capacitor. However, although this example discusses curved surfaces and curved components, it should be understood that, in other embodiments, locking ring portion 46 and/or support portion 48 need not be curved or cylindrical. In fact, any curved surface discussed herein could be replaced with a suitable planar or multi-faceted surface in other embodiments.

In this view, first end wall 50 is also visible. First end wall 50 extends between sides 16 and 18 at first end 12. Although not visible in FIG. 4, pin pairs 34A and 34B extend through the body of end wall 50. Second end wall 54 is also visible extending between sides 16 and 18 at second end 14. A curved support surface 52 is defined at the top of second end wall 54. As noted above, although surface 52 is curved in this example, other surface profiles could be used. Surface 52 can be used to support a component that extends the entire length of module body 11 from first end 12 to second end 14.

Module body 11, however, can be used to support components of any suitable length. For instance, lower support members 25 and fingers 30 are positioned along the length of module body so as to support components that do not extend all the way to second end 14. Additionally, a partial lower support member 27 extends outward from sides 16 and 18 adjacent to or near locking ring portion 46 and first end support portion 48. Lower support members 25 and 27, in combination with fingers 30, allow for flexibility in the length of components supported by module body 11.

FIGS. 4B-4G show aspects of support members 25 and fingers 30 in closer detail. Beginning with FIG. 4B, a perspective view of a cross-section of a side (e.g. 16 or 18) is shown. Namely, a finger 30 and adjacent lower support member 25 are visible. A dashed line indicates the side of a generally cylindrical capacitor 66 supported by module 10.

Each finger 30 comprises a support face 30.1 which faces inward and downward toward the side of the supported component. Support face 30.1 may be planar or may be curved so as to accommodate the curved surface of the supported component. Lower support member 25 includes shelf member 25.1, which may be curved or planar, and buttress member 25.2, which in this example is curved to match the curvature of component 66.

Figure 4C:
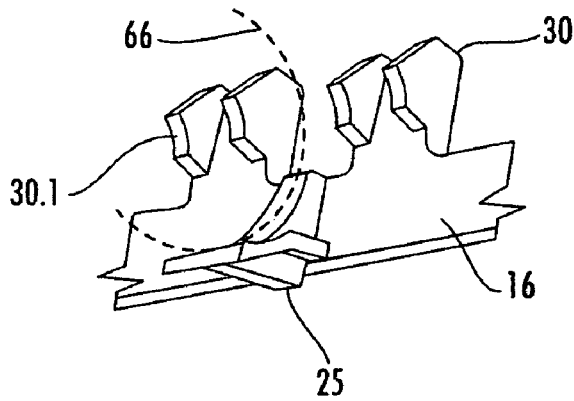

FIG. 4C is another perspective view clarifying the arrangement of fingers 30 relative to lower support member 25. In this embodiment, each lower support member 25 is positioned intermediate two fingers 30.

Figure 4D:
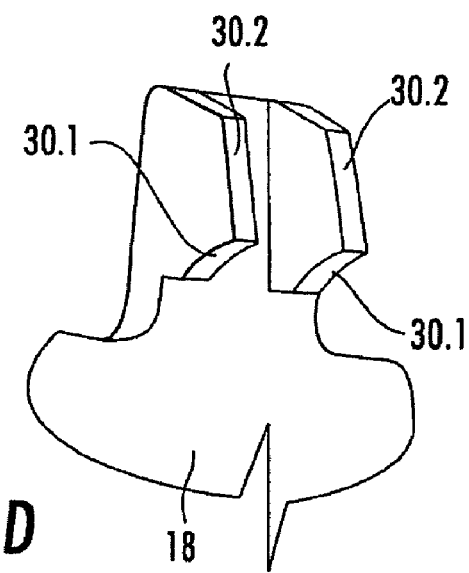
Figure 4E:
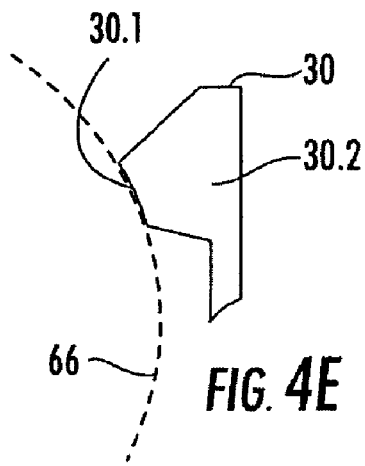

FIG. 4D shows a finger 30 from a side as viewed from inside module body 11. Each finger 30 in this embodiment actually comprises two transverse members 30.2 which each provide a support face 30.1. FIG. 4E shows finger 30 of FIG. 4D as viewed from an end of module 10. Again, the dashed line indicates the outer perimeter of supported component 66.

Figure 4F:
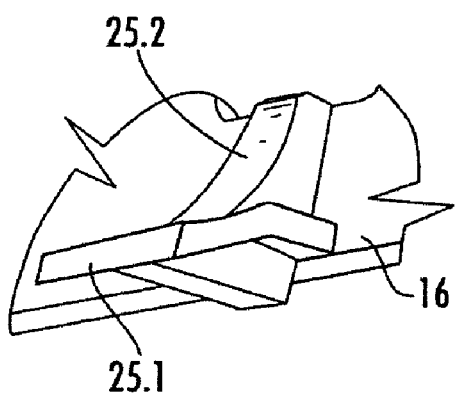
Figure 4G:
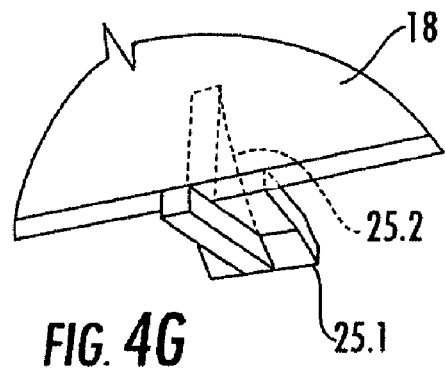

FIGS. 4F and 4G show a close-up view of a lower support member 25 as viewed from inside module body 11 and outside module body 11, respectively. Shelf member 25.1 and buttress member 24.2 are visible in FIG. 4F, along with a dashed line indicting the perimeter of supported component 66. FIG. 4G illustrates shelf member 25.1 as viewed looking toward side 18, with buttress member 25.2 illustrated in phantom.

Partial lower support member 27 may comprise a shelf member similar to 25.1, but without a buttress member 25.2. Instead, in one embodiment, part of a lower locking ring portion 46 occupies the space which would correspond to a buttress member of partial lower support member 27.

The curvature of face 30.1, buttress member 25.2, and shelf member 25.1 may be varied to accommodate cylindrical components of various sizes. Any or all of face 30.1, buttress member 25.2, and shelf member 25.1 may comprise planar or multi-faceted surfaces angled to be tangent to the curved surface of a supported component.

The relationship between face 30.1, buttress members 25.2, and shelf members 25 and the surface of a supported component can vary. In some embodiments, the angle or curvature of these faces/surfaces is selected so as to allow for the same module 10 to support different components having different radii.

Additionally, any of fingers 30, lower support members 25, partial lower support members 27, and/or any other components of module 10 can be constructed of materials that flex or otherwise provide sufficient "give" to accommodate production tolerances while still maintaining a secure grip or other contact with the supported component.

For instance, a component may be positioned with an end supported by portion 48 and locking ring portion 46, with the body of the component extending towards end 16 but only reaching the lower support member 25 nearest end 12. In some embodiments, module body 11 is configured to support components, such as electrolytic capacitors, having a length from about 20 mm to about 40 mm. The term "about" is used to indicate that the actual lengths may vary within acceptable tolerances.

The length, width, and height of module 10 can be varied according to the needs of a particular application. Furthermore, the number and/or configuration of fingers 30, lower support members 25, and partial support members 27 can be adjusted according to needs. In the examples herein, lower support members 25 are positioned intermediate adjacent fingers 30. However, in other embodiments, lower support members 25 can be positioned at any suitable location(s) along the sides of module body 11. Similarly, fingers 30 and lower support members 25 are symmetrical about the length of body 11 in examples herein. Other embodiments do not feature such symmetry.

Figure 5:
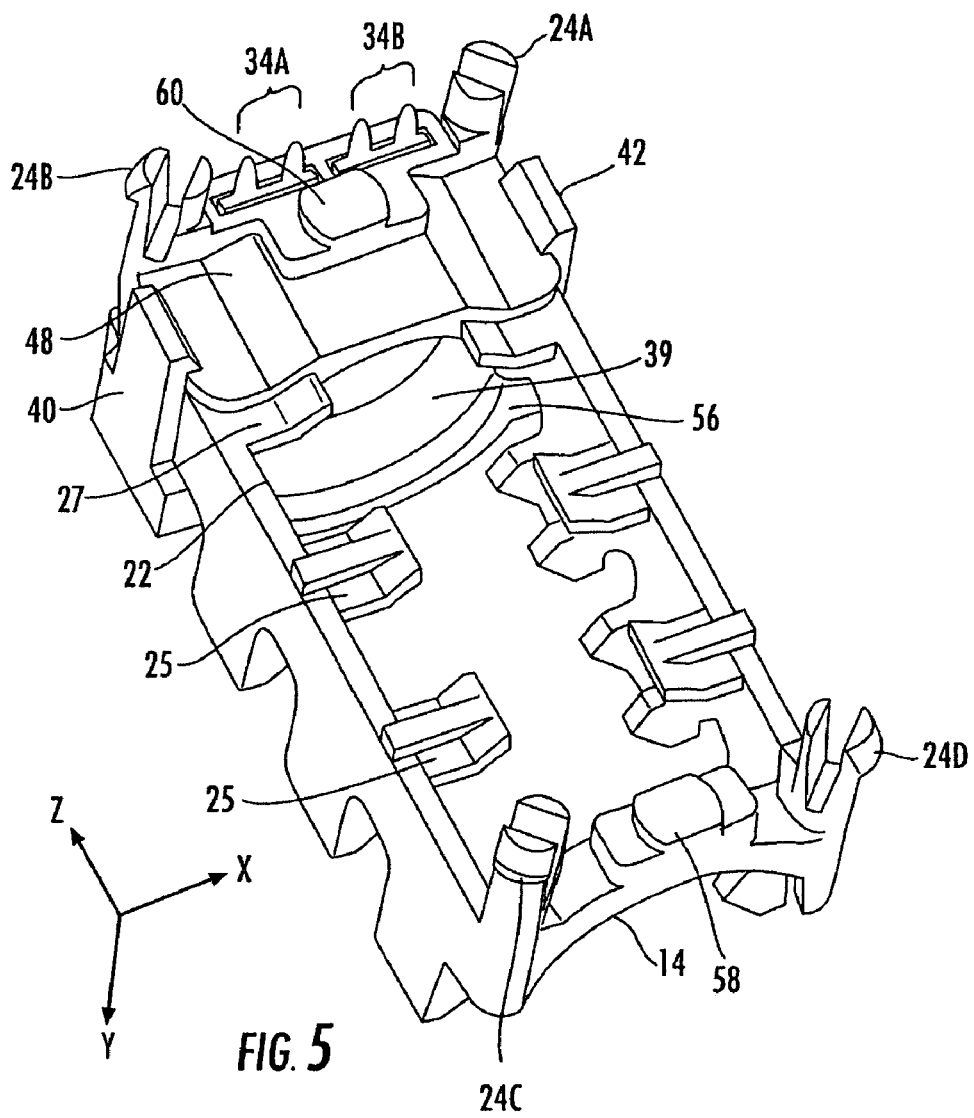
FIG. 5 is a perspective view of an exemplary connector module as viewed from the bottom and second end.

FIG. 5 is a perspective view of component module 10 from bottom side 22. In this view, lower support members 25 and partial support members 27 can be seen extending from sides 16 and 18. Additionally, all four legs 24A, 24B, 24C, 24D of this example can be seen, along with pin pairs 34A and 34B.

Further, additional aspects can be appreciated in this view. Underside 39 of cover body 38 can be seen. Underside 39 defines a curved surface which may, for example, match the curved surface at the top of a component supported by module body 11 and secured by cover 36. Generally, the curved surface comprises at least a portion of the bottom of cover body 38, and represents a curvature toward the top of cover body 38 about an axis that is parallel to the length of cover body 38.

In this example, cover body 38 comprises a cover locking ring portion 56, which in this example comprises a protrusion from cover body 38. Cover locking ring portion 56 and body locking ring portion 46 complement one another to define a one locking ring when the cover 36 is positioned on module body 11.

In this example, a single locking ring is defined. However, it will be appreciated that, in other embodiments, multiple lower locking ring portions and/or cover locking ring portions could be used. For example, multiple lower and cover portions could respectively define a plurality of locking rings.

Figure 6A:
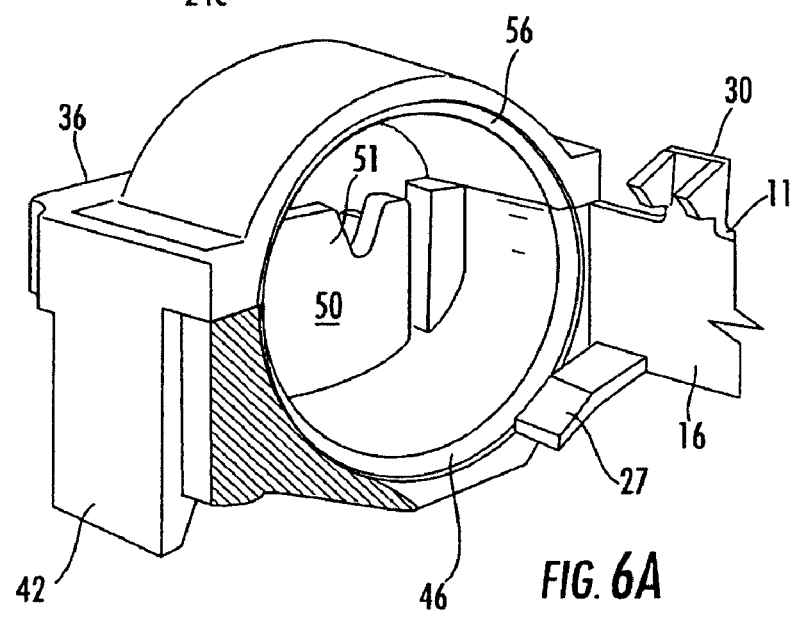
FIG. 6A is a partial perspective view showing the positioning of a locking ring in an exemplary connector module.

Turning briefly to FIG. 6A cover ring portion 56 and body ring portion 46 are shown in isolation, along with some other aspects of module body 11 and cover 36. A locking ring defined by cover 36 and module body 11 may be substantially continuous—that is, the protrusion(s) defining the ring may define a true ring shape that surrounds a component placed in connector module 10. However, at least two discontinuities in the ring will exist in embodiments where the cover locking ring portion and lower locking ring portion meet one another. In some embodiments, there are further discontinuities. For instance, either or both a cover locking ring portion and/or a lower locking ring portion may comprise a series of protrusions FIG. 6B shows three examples of locking rings in cross-section at (I), (II), and (III). The locking ring at (I) is the one shown in FIG. 6A, comprising a cover locking ring portion 56 and a lower locking ring portion 46. The protrusion comprising cover locking ring portion 56 extends along the curved surface of the cover along its length along the lateral (i.e. X) axis. At (II), the locking ring includes several discontinuities: cover locking ring portions 56A, 56B, and 56C and lower locking ring portions 46A, 46B, and 46C form the locking ring. The locking ring at (III) is illustrated to indicate that the upper and lower locking ring portions need not be the same—cover ring portions 56D and 56E are not continuous, while a continuous lower locking ring portion is used.

Although these examples discuss locking rings of generally circular cross-section, other locking ring structures could include straight lines. For example, some or all of the locking ring could define a polygon when viewed in cross-section. Thus, although the term "locking ring" is used herein, it should be abundantly clear that not all embodiments require a true "ring" structure.

Turning back to FIG. 5, the bottom side view of connector module 10 illustrates additional components, such as bottom standoff structures 58 and 60 located at ends 14 and 12, respectively. FIG. 7A provides a close-up view of bottom standoff structure 60 at first end 12. In this view, end support area 48 is also visible, along with the ends of tabs 40 and 42. Each bottom standoff structure 58 and 60 comprises an outer member 64 extending outward from a main support member 62. FIG. 7B shows bottom standoff structure 58 at end 14. In this example, bottom standoff structure 58 also comprises an outer member 64 extending outward from main support member 62. However, bottom standoff structures 58 and 60 need not be identical in all embodiments.

In this view, end wall 54 and legs 24D and 24C are also visible. FIG. 7B also illustrates a printed circuit board (PCB) 28 having an upper surface 28.1 and lower surface 28.2. Legs 24C and 24D pass through respective openings 26C and 26D to lock connector module 10 onto the board. In this example, outer member 64 rests on upper surface 28.1 of PCB 28.

Additionally, protrusions 24.3 and 24.4 on each leg cooperate to tightly hold the connector module to PCB 28 as noted above.

The particular material used to construct component connector module 10 is not critical so long as the assembly can perform to specifications. For instance, some materials may be better suited to certain operating environments, while other materials may be better suited to different operating environments. Generally speaking, ruggedized plastic can yield good results in a wide variety of operating environments. If plastic is used, the plastic should have a good combination of strength, elasticity, and dimensional stability. For example, in some embodiments, a glass filled 30% PBT (Polybutylene terephthalate) may be a good choice. The glass can add strength to the part, but not enough to render the module brittle or otherwise lose its elastic properties. PBT is also known for its dimensional stability.

Module body 11 and cover 36 may be constructed from discrete components (e.g. separate parts for fingers 30, legs 24, lower supports 25, etc.) joined together by bonding, fusing, adhesives, or any other technique. In some embodiments, module body 11 and/or cover 36 are formed as single components, e.g. by injection or other molding processes. Alternatively, module body 11 and/or cover 36 may be formed by machining down blocks or other materials. Of course, a combination of molding, joining, and machining down may be used to construct module body 11 and cover 36, and the present subject matter is not to be limited by the method by which connector module 10 parts are constructed.

Figure 8:
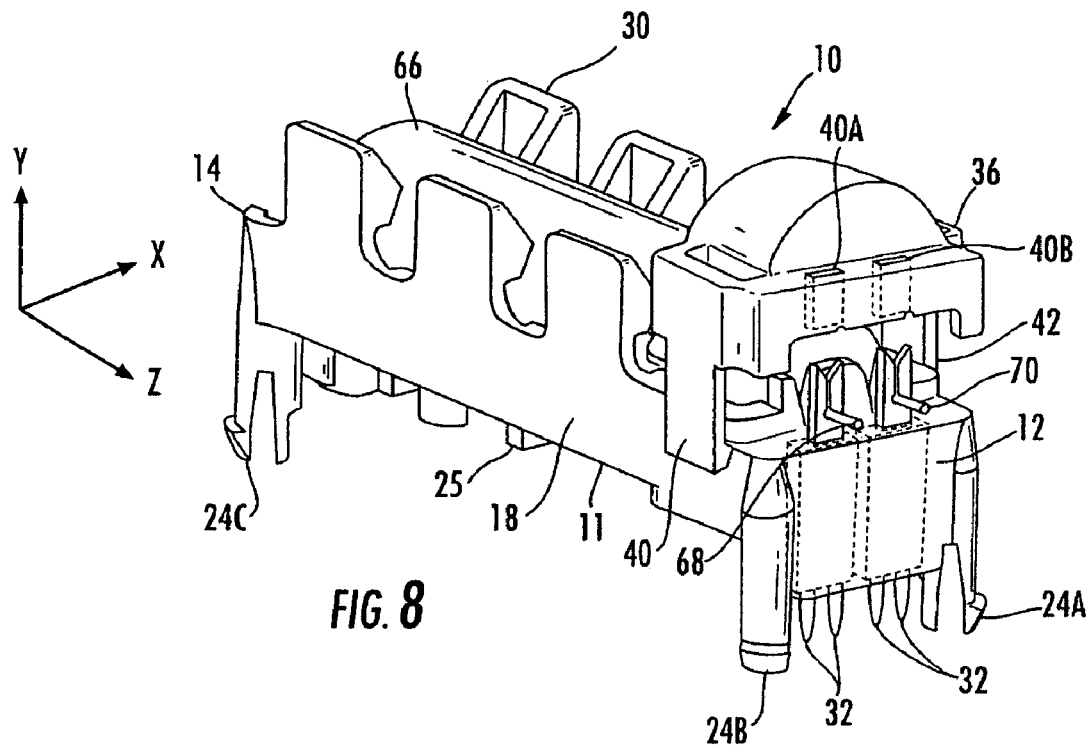
FIG. 8 is a perspective view of an exemplary connector module supporting a component with the connector module cover removed.
Figure 9:
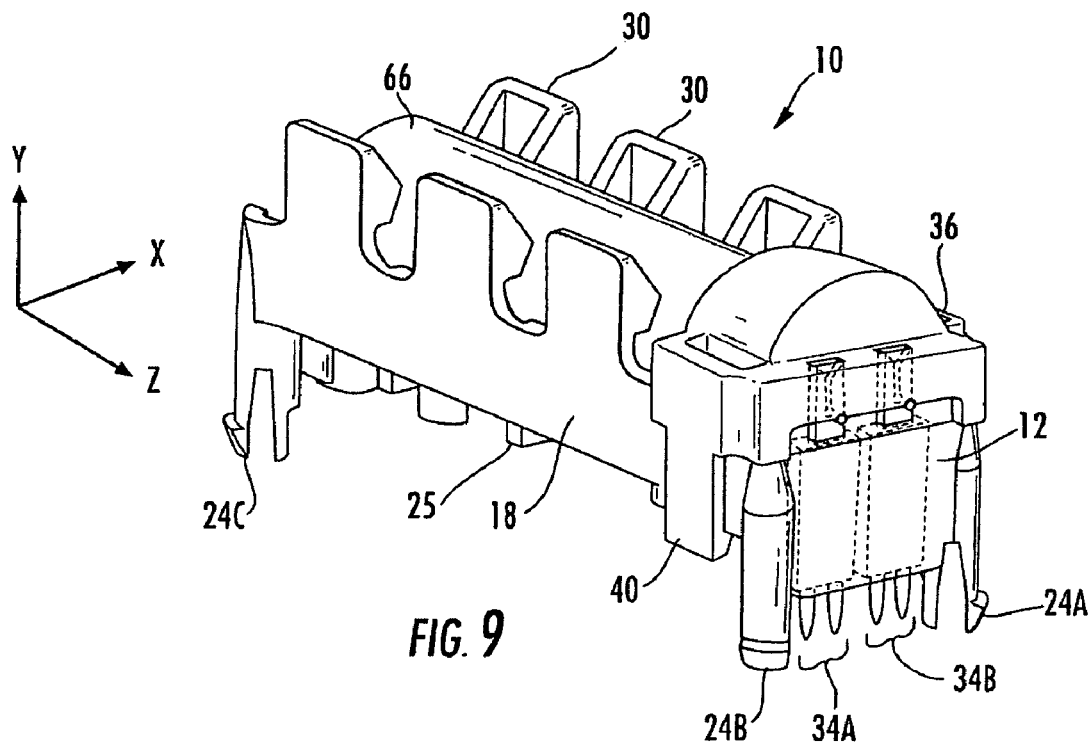
FIG. 9 is a perspective view of an exemplary connector module supporting a component with the connector module cover lockingly engaged to the connector module body.

Turning now to FIG. 8 and FIG. 9, an connector module 10 is shown supporting a component, in this example, an electrolytic capacitor 66. Electrolytic capacitor 66 of this example is a generally cylindrical body having two electrodes 68 and 70 emerging from one end of the capacitor body.

Capacitor 66 is positioned on module body 11 and is supported by lower support members 25 and 27. Fingers 30 engage the sides of capacitor 66 as discussed above. FIG. 8 illustrates connector module 10 with cover 36 removed, while FIG. 9 shows connector module 10 with cover 36 locked into place.

In this example, electrodes 68 and 70 are positioned between adjacent pins 32 in each pair of pins 34A and 34B (best seen in FIG. 8). As cover 36 is moved downward, pins 34A and 34B are received by respective passages 40A and 40B in cover body 38. Openings 40A and 40B are illustrated by dashed lines. As cover 36 is moved down and in engagement with module body 11, the sides of openings 40A and 40B may impart pressure to pins 32 to provide better contact between capacitor electrodes 68 and 70 and respective pin pairs 34A and 34B, if needed.

In this example, the upper ends of pairs 34A and 34B are configured to act as IDC (insulation displacing connector) terminations. Cover 36 can protect and insulate the IDC terminations provided by pins 32.

At the same time, locking ring(s) provided by protrusions from module body 11 and cover 36 engage the body of capacitor 66 and securely hold it in the module. In some embodiments, capacitor 66 can have one or more corresponding depressions or grooves in its outer surface and extending around some or all of its perimeter. The depressions/grooves can complement the protrusions comprising the locking ring(s) of module 10, or may be otherwise configured to receive the locking ring(s). This can provide for a better grip between the module and capacitor (or other component).

As was noted above, a locking ring may be substantially continuous or may feature discontinuities. Similarly, the depression/groove(s) in capacitor 66 may be continuous, substantially continuous, or may feature one or more discontinuities. The discontinuities in depressions/grooves of the capacitor may or may not correspond to those of the locking ring(s).

With a capacitor 66 (or other component) securely positioned on and supported by module 10, module 10 can then be engaged in any suitable application. For instance, module 10 may be interfaced to or mounted to a printed circuit board as noted in the examples above. The printed circuit board can comprise other suitable circuit components (e.g. resistors, inductors, transistors, diodes, capacitors, etc.) connected to one another by traces, wires, and the like.

Capacitor 66 can be interfaced to the circuit via suitable terminals or other receiving points for pin pairs 34A, 34B. In this example, four pins in two groups are used for connecting to two electrodes at first end 12 of module 10. The pins can be configured as needed for particular circuit applications. For example, the pins can be constructed of suitable materials so as to have a push-out force of around 42 Newtons (N) per pin. The remainder of the pins may have any suitable shape as well.

However, it should be understood that any suitable number of pins, in any suitable grouping, could be used in accordance with the present subject matter. Further, the pins could be positioned at other points on module body 11.

For example, one or more other pins could extend downward from the body at second end 14, with appropriate components for connection to an electrode or electrodes at that end. For instance, a capacitor or other component could have an electrode (or multiple electrodes) at each end.

Regardless of the positioning of pins and/or electrodes, it will be appreciated that, in some instances, use of a connector module comprising one or more aspects of the present subject matter can be quite advantageous. For instance, without a connector module, a capacitor (such as capacitor 66) would need to be mounted directly to a printed circuit board. This could entail, for instance, positioning the capacitor on its side (i.e. with its ends perpendicular to the PCB), which could use up a significant amount of PCB "real estate." Less space would be needed if capacitor 66 were vertically mounted (i.e. with its ends parallel to the PCB), but such a configuration would require careful handing/construction of the electrodes. Furthermore, depending upon the size of the capacitor, positioning the capacitor in this manner could substantially increase the vertical height of the PCB.

Instead, when a connector module is used, the module provides some stand-off for the capacitor. Other PCB components (e.g. circuit components) may even occupy the space on the board below the capacitor/module assembly.

Additionally, the use of a connector module configured in accordance with one or more aspects of the present subject matter can allow for automated assembly operations that support the use of electrolytic capacitors. For example, high-temperature soldering of an electrolytic capacitor to a PCB may be precluded by the temperature tolerance of the capacitor. Thus, cumbersome secondary soldering would ordinarily be needed. However, the connector module allows for attachment without the need to solder the capacitor.

Instead, the module can be pressed into the PCB. In some embodiments, a connector module can be added to a circuit after a component is already enclosed therein. As another example, the connector module can be positioned "empty" on a PCB and then the supported component added. After that, the cover could be locked onto the module body, or the module could be used without a cover (although this would not be ideal in many circumstances). For example, the capacitor can be added automatically after high-temperature soldering is performed on other components.

Although the examples above related to supporting a single component, modules could be configured in accordance with the discussion herein so as to support multiple components, if desired.

It is appreciated by persons skilled in the art that what has been particularly shown and described above is not meant to be limiting, but instead serves to show and teach various exemplary implementations of one or more aspects of the present subject matter. As set forth in the attached claims, the scope of the present invention includes both combinations and sub-combinations of various features discussed herein, along with such variations and modifications as would occur to a person of skill in the art.

What is claimed is:

1. A connector module for supporting an electronic component, the connector module comprising:
   a module body defining a top, bottom, and a plurality of sides, the sides extending between first and second ends of the module body and comprising at least one support member comprising a surface configured to provide contact with a lower surface of a component supported on the module body; and
   a plurality of pins extending through an end of the module body to emerge from the top and the bottom from the module body;
   wherein the module body is configured to support a component so that, when supported by the at least one support member, at least one electrode of the component is in contact with at least some of the plurality of pins emerging from the top of the module body.

2. The connector module set forth in claim 1, further comprising a plurality of fingers extending upward from the sides of the module body, each of the plurality of fingers comprising a surface configured to provide contact with an upper surface of a component supported on the module body.

3. The connector module set forth in claim 1, further comprising a plurality of legs extending downward from the module body.

4. The connector module set forth in claim 3, wherein each leg comprises a plurality of spaced-apart flexible members.

5. The connector module set forth in claim 4, wherein a first spaced-apart member comprises a retention feature and a second spaced-apart member comprises a protrusion, with the protrusion and the retention feature spaced apart in a vertical direction so that, when the leg is positioned through an opening in a printed circuit board, the protrusion contacts a bottom surface of the printed circuit board and the retention feature contacts another surface of the printed circuit board.

6. A connector module for supporting an electronic component, the connector module comprising:
   a module body defining a top, bottom, and a plurality of sides, the sides extending between first and second ends of the module body and comprising at least one support member comprising a surface configured to provide contact with a lower surface of a component supported on the module body; and
   a plurality of pins extending through an end of the module body to emerge from the top and the bottom from the module body;
   wherein the module body is configured to support a component so that, when supported by the at least one support member, at least one electrode of the component is in contact with at least some of the plurality of pins emerging from the top of the module body; and
   further comprising a cover, the cover configured to be removably secured to an end of the module body so as to cover an upper portion of a component supported on the module body.

7. The connector module set forth in claim 6, wherein the cover comprises at least one passage configured to receive the portion of the pins that extend upward from the top of the module body.

8. The connector module set forth in claim 6, wherein the cover comprises:
   a cover body that covers the upper portion of a component supported on the module body; and
   a plurality of tabs extending downward form the locking cover body, the tabs configured to engage the sides of the module body and removably secure the locking cover to the module body.

9. The connector module set forth in claim 6, wherein the cover further comprises at least one protrusion configured to contact an upper portion of a component supported on the module body so that the cover helps secure the component in place.

10. The connector module set forth in claim 9, wherein the module body comprises at least one protrusion configured to contact a lower portion of a component generally opposite the upper portion of the component contacted by the at least one protrusion of the cover.

11. The connector module set forth in claim 10, wherein the at least one protrusion of the cover and the at least one protrusion of the module body form a locking ring.

12. The connector module set forth in claim 11, wherein the locking ring has a generally circular shape.

13. The connector module set forth in claim 6, further comprising an electrolytic capacitor supported on the module body, the cover removably secured to an end of the module body so as to cover an upper portion of the electrolytic capacitor.

14. The connector module set forth in claim 13, wherein the electrolytic capacitor comprises a plurality of electrodes, each electrode positioned between a pair of adjacent pins where the pins emerge from the top of the module body.

15. A circuit assembly comprising:
   a module body defining a top, bottom, and a plurality of sides extending between first and second ends of the module body, wherein the module body comprises:
      a plurality of flexible fingers positioned along the sides, and
      at least one body locking ring portion at the first end of the module body,
      the at least one body locking ring portion comprising a protrusion extending upward from the bottom of the module body and inward from the sides;
   a plurality of legs extending outward from the bottom of the body, each leg comprising a plurality of members adapted to lockingly engage a corresponding opening in a circuit board;
   a locking cover adapted to engage the body at the first end, the locking cover comprising:
      a cover body configured to extend over an end of the module body, from one side to another, when the locking cover is positioned at the first end of the module body,
      at least one cover locking ring portion extending downward from the bottom of the locking cover body, each at least one cover locking ring portion configured to complement a corresponding body locking ring portion to define at least one locking ring when the locking cover is positioned on the body at the first end, and a plurality of tabs extending downward form the locking cover body, the tabs configured to engage the sides of the body and removably secure the locking cover to the body; and a plurality of pins extending through the module body at the first end and extending downward form the module body, the pins also extending upward from the top of the module body at the first end.

16. The connector assembly set forth in claim 15, further comprising an electrolytic capacitor comprising a plurality of electrodes, the capacitor positioned on the module body so that the electrodes are in electrical contact with the plurality of pins;

wherein the locking cover is positioned to engage the body on the first end so that the body locking ring portion and cover locking ring portion securely hold the electrolytic capacitor to the body.

17. A circuit assembly comprising a circuit board and the connector assembly set forth in claim 15, wherein the circuit assembly comprises:

a plurality of circuit components, the circuit components connected to a plurality of contacts adapted to engage connector pins, and a plurality of holes adapted to receive the plurality of legs; and wherein the connector assembly is positioned on the circuit board with the plurality of connector pins engaged with the plurality of contacts and the plurality of legs engaged into the plurality of holes so that the capacitor is in electrical connection with the circuit components while positioned above the circuit board.

18. The connector assembly set forth in claim 15, wherein the locking cover body includes a plurality of openings, each opening configured to receive and engage a pair of pins that extend upward from the module body and apply pressure therebetween.

19. The connector assembly set forth in claim 15, wherein the locking ring cover portion and locking ring body portion each respectively comprise respective parts of a locking ring having a generally circular shape.

20. The connector assembly set forth in claim 15, wherein each leg comprises a first spaced-apart member including a retention feature and a second spaced-apart member comprising a clip protrusion; and wherein the clip protrusion and the retention feature are spaced apart in a vertical direction so that, when the leg is positioned through an opening in a printed circuit board, the clip protrusion contacts a bottom surface of the printed circuit board and the retention feature contacts another surface of the printed circuit board.

* * * * *